(12) United States Patent
Kamegawa

(10) Patent No.: US 7,340,583 B2
(45) Date of Patent: Mar. 4, 2008

(54) METHOD AND APPARATUS OF CONTROLLING MEMORY DEVICE

(75) Inventor: Hideki Kamegawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 471 days.

(21) Appl. No.: 10/968,256

(22) Filed: Oct. 20, 2004

(65) Prior Publication Data
US 2005/0204116 A1   Sep. 15, 2005

(30) Foreign Application Priority Data
Mar. 9, 2004   (JP)   .............................. 2004-064918

(51) Int. Cl.
    *G06F 12/00*   (2006.01)
(52) U.S. Cl. ............................ 711/217; 711/2; 711/170
(58) Field of Classification Search .................. 711/217
    See application file for complete search history.

(56) References Cited

U.S. PATENT DOCUMENTS 5,708,842 A * 1/1998 Ikegaya et al. ................ 712/36
6,480,936 B1 * 11/2002 Ban et al. .................... 711/118

FOREIGN PATENT DOCUMENTS

JP   07-105081   4/1995

* cited by examiner

*Primary Examiner*—Brian R. Peugh
*Assistant Examiner*—Matthew Bradley
(74) *Attorney, Agent, or Firm*—Nixon Peabody LLP; Donald R. Studebaker

(57) ABSTRACT

An address decoder 10 decodes an address signal 20 to generate access signals 22, 24. An OR circuit implements a logical OR of the signals 22, 24 to generate a chip enable signal. An address generation circuit 14 generates an address signal 28 to access the RAM in ascending order from a head address based upon the signal 20. An address inversion circuit 16 inverts and outputs each bit of the signal 28 when the signal 24 is "1" or outputs the address signal without inversion when the signal 24 is "0." When the chip enable signal is "1," the RAM performs reading/writing data according to an address signal 30 from the inversion circuit.

5 Claims, 8 Drawing Sheets

ADDRESS INVERSION CIRCUIT

ROM-SPACE ADDRESS HOLDING REGISTER

METHOD AND APPARATUS OF CONTROLLING MEMORY DEVICE

BACKGROUND OF THE INVENTION

1. Field of the Invention

The present invention relates to a method and an apparatus of controlling a memory device, which generate an address signal supplied to a memory device based upon an address signal supplied from an outside.

2. Description of the Related Art

Software which operates on a microcomputer typically uses a ROM (Read Only Memory) and a RAM (Random Access Memory) as a resource in the microcomputer. The ROM is provided for storing a computer program and the RAM is provided for holding data generated in the program. In an EVA chip (evaluation chip), it is general to provide a device to physically operate as the RAM to an address space provided for the ROM and an address space provided for the RAM in view of easiness of program debug.

FIG. 6 is a block diagram showing an example of the configuration of the EVA chip and illustrates a relation of a RAM, a ROM, and a central processing unit (CPU). In FIG. 6, the RAM 62, the ROM 64, and a peripheral device 66 performing, for example, an interruption control or a DAM transfer control are connected to the CPU 60 through a bus 68, and further a debugger 70 is connected directly to the CPU 60. The debugger 70 is provided based upon JTAG (Joint Test Action Group) standard most of the time and the CPU 60 is directly controlled by use of ICE (In-circuit Emulator) debugger, to provide access to the bus 68. Further, a device which physically operates as the RAM is provided in each of the RAM 62 and the ROM 64.

FIG. 7 is a view of a detailed description of portions of the RAM 62 and the ROM 64 out of the configuration of the EVA chip shown in FIG. 6. In FIG. 7, an address decoder 80 receives and decodes an address signal 84 to be output from the CPU 60 to the bus 68, to generate an access signal 86 to indicate access to the ROM 64 and an access signal 88 to indicate access to the RAM 62. An address generation circuit 82 generates an address signal 90 supplied to the RAM 62 and the ROM 64 by receiving the address signal 84.

The RAM 62 receives the access signal 88 as an access enable, and writes in or reads out the data according to the address signal 90 supplied from the address generation circuit 82, and the ROM 64 receives the access signal 86 as an access enable, and writes in or reads out the data according to the address signal 90 supplied from the address generation circuit 82. Both the RAM 62 and the ROM 64 are devices that physically operate as the RAM as described before and the RAM 62 is used as RAM and the ROM 64 is used as ROM.

FIGS. 8 to 10 illustrate the excerpts of a ROM space and a RAM space with regard to an address space controlled by the CPU 60 in FIG. 6. In addition, the Address (ROM) and the Address (RAM) show a head address of the ROM space and a head address of the RAM space, respectively. In FIG. 8, the RAM device 0 (corresponding to the RAM 62) and the RAM device 1 (corresponding to the ROM 64) are located in a part of the RAM space from the Address (RAM). In FIG. 9 the RAM device 0 and the RAM device 1 are located in a part of the ROM space from the Address (ROM). In FIG. 10 the RAM device 0 and the RAM device 1 are located in parts of the RAM space and the ROM space from the Address (RAM) and the Address (ROM), respectively.

It is typical to sequentially access the RAM in ascending order, but there is a case where access to the RAM is sequentially made in descending order (for example, refer to Japanese Patent Laid-Open Publication No. H11-340958).

However, there is a case where a memory capacity of each physical RAM provided to the ROM space and the RAM space controlled by the CPU is desired to be changed freely depending on an object in use of a computer system. For example, a capacity ratio between the physical RAMs provided to the ROM space and the RAM space in the EVA chip controlled by the CPU is required to change flexibly so that the EVA chip is provided to developments of various software operated in the microcomputer. However, since it is not easy to change the physical RAM assembled inside an apparatus, the conventional configuration shown in FIG. 7 has the problem that it is difficult to change the memory capacity of the physical RAMs 62 and 64 provided to the ROM space and the RAM space, respectively.

A demand on changing the memory capacity can be met by mounting many physical RAMs each having a small memory capacity, but an increase of the number of physical RAMs to be mounted causes an increase of the mounting area or costs.

SUMMARY OF THE INVENTION

The present invention is made in order to solve such foregoing problems. It is an object of the present invention to provide a method and apparatus of controlling a memory device, which can easily change a capacity of a physical RAM provided to each of a ROM space and a RAM space managed by a CPU.

To solve the foregoing problems, according to the present invention, there is provided a method of controlling a memory device, for appropriating the memory device to a first address space and a second address space in an address space which is managed by a central processing unit, which comprises the steps of generating, when an address signal of the first address space is provided from the central processing unit, a first address signal to access the memory device from a head address in ascending order based upon the address signal to supply the first address signal to the memory device; and generating, when an address signal of the second address space is provided from the central processing unit, a second address signal to access the memory device from a final address in descending order based upon the address signal to supply the second address signal to the memory device.

According to the present invention, there is provided a memory device controlling apparatus for appropriating a memory device to a first address space and a second address space in an address space which is managed by a central processing unit, which comprises means for generating, when an address signal of the first address space is provided from the central processing unit, a first address signal to access the memory device from a head address in ascending order based upon the address signal to supply the first address signal to the memory device; and means for generating, when an address signal of the second address space is provided from the central processing unit, a second address signal to access the memory device from a final address in descending order based upon the address signal to supply the second address signal to the memory device.

According to the present invention, there is provided a memory device controlling apparatus for appropriating a memory device to a first address space and a second address space in an address space which is managed by a central processing unit, which comprises address decode means for generating a first access signal when an address signal of the first address space is provided from the central processing unit and generating a second access signal when an address signal of the second address space is provided from the central processing unit; logic operation OR means for generating a chip enable signal by implementing a logical OR operation of a first access signal and a second access signal generated by the address decode means to output the chip enable signal to the memory device; address generation means for generating a third address signal to access the memory device from a head address in ascending order based upon an address signal provided from the central processing unit; and address-inverting means for inverting the third address signal generated by the address generation means for supply to the memory device when the second access signal is generated by the address decode means, and supplying the third address signal as it is to the memory device when the second access signal is not generated.

Therefore, according to the present invention, when an address signal of a first space in an address space is given from a central processing unit, access to a memory device in ascending order from a head address thereof is provided and when an address signal of a second space in the address space is given from the central processing unit, access to a memory device in descending order from a final address thereof is provided. Therefore, a memory capacity of the memory device corresponding to the first space and a memory capacity of the memory device corresponding to the second space can be freely changed in the range of a total memory capacity of the memory device. For example, in the development using an EVA chip, each capacity of the memory devices corresponding to the first space and the second space controlled by the CPU can be simply changed in response to the development progress of software in the range of a total memory capacity of the memory device.

Further, according to the present invention, an uppermost address signal among the address signals supplied to a memory device when an address signal of a first space in an address space is given from a central processing unit, and a lowest address signal among the address signals supplied to a memory device when an address signal of a second space in an address space is given from a central processing unit are compared to each other. Therefore, an interference state between an address space of the memory device corresponding to the first space and an address space of the memory device corresponding to the second space can be promptly detected. For example, in the development using an EVA chip, access to an unexpected region of a physical RAM in software is occurred, the access can be detected at an early stage.

DETAILED DESCRIPTION OF THE INVENTION

Figure 1:
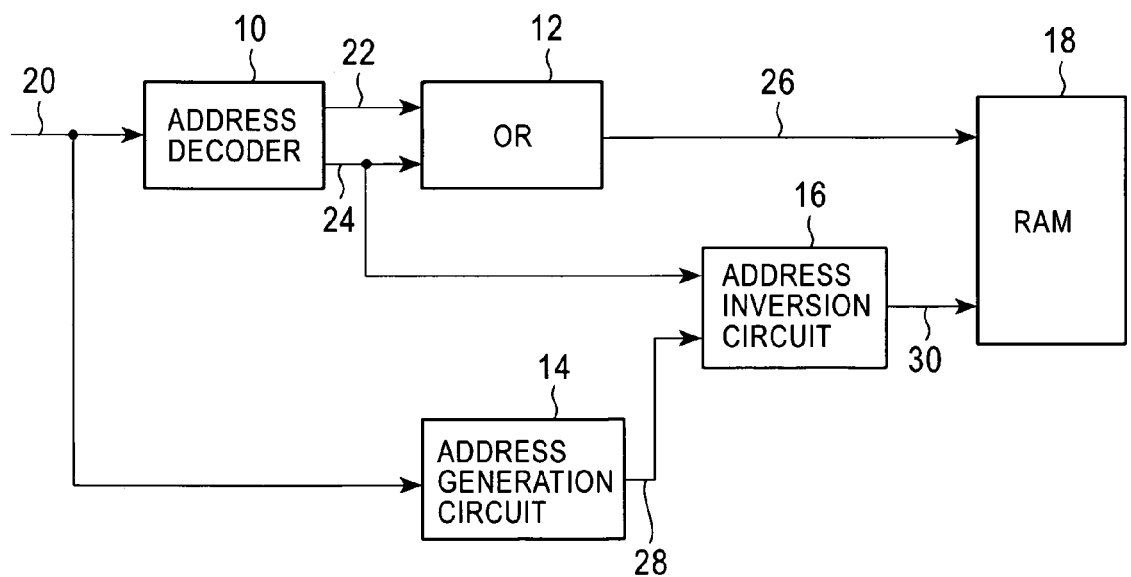
FIG. 1 is a block diagram showing a first embodiment of a memory device controlling apparatus according to the present invention.

Embodiments of a memory device control method and an apparatus thereof according to the present invention will be described with reference to the accompanying drawings. A first embodiment of a memory device controlling apparatus according to the present invention, as shown in FIG. 1, includes an address decoder 10, an OR circuit 12, an address generation circuit 14, an address inversion circuit 16, and a RAM 18. In addition, the reference numerals attached to connection lines show signals appear in the connection lines (the same as in FIGS. 2 to 5). In the embodiment, address impress and logic per a byte unit all are provided on the assumption of positive logic (the same as in a second embodiment).

Address signals 20 input to the address decoder 10 and the address generation circuit 14 are address signals supplied from an external central processing unit (CPU) and address signals of a first address space and a second address space of an address space controlled or managed by the CPU. In the embodiment the first address space is a space accessed by setting the RAM 18 as a RAM (hereinafter referred to as RAM address space) and the second address space is a space accessed by setting the RAM 18 as a ROM (hereinafter referred to as ROM address space).

The address decoder 10 determines whether the address signal 20 is the address signal of the RAM address space or that of the ROM address space by decoding the address signal 20. When the address signal 20 is the address signal of the RAM address space, the access signal 22 is generated and when the address signal 20 is the address signal of the ROM address signal, the access signal 24 is generated. Herein the access signal 20 is a chip enable signal indicating use of the RAM 18 as the RAM and the access signal 24 is a chip enable signal indicating use of the RAM 18 as the ROM. When the RAM 18 is set as a selection state in either of the above, the logic becomes "1."

The OR circuit 12 connected to the address decoder 10 is a logic operation OR circuit which generates a chip enable signal 26 by implementing logical OR of the access signal 22 and the access signal 24. Accordingly, the chip enable signal 26 shows logic "1" when at least one of the access signal 22 and the access signal 24 is logic "1." The address generation circuit 14 generates the address signal 28 based upon the address signal 20. In the embodiment, when the address signal 20 is a signal generated in ascending order from a head address of the RAM address space or the ROM address space, the address signal 28 to access the RAM 18 in ascending order from the head address thereof is generated.

Figure 2:
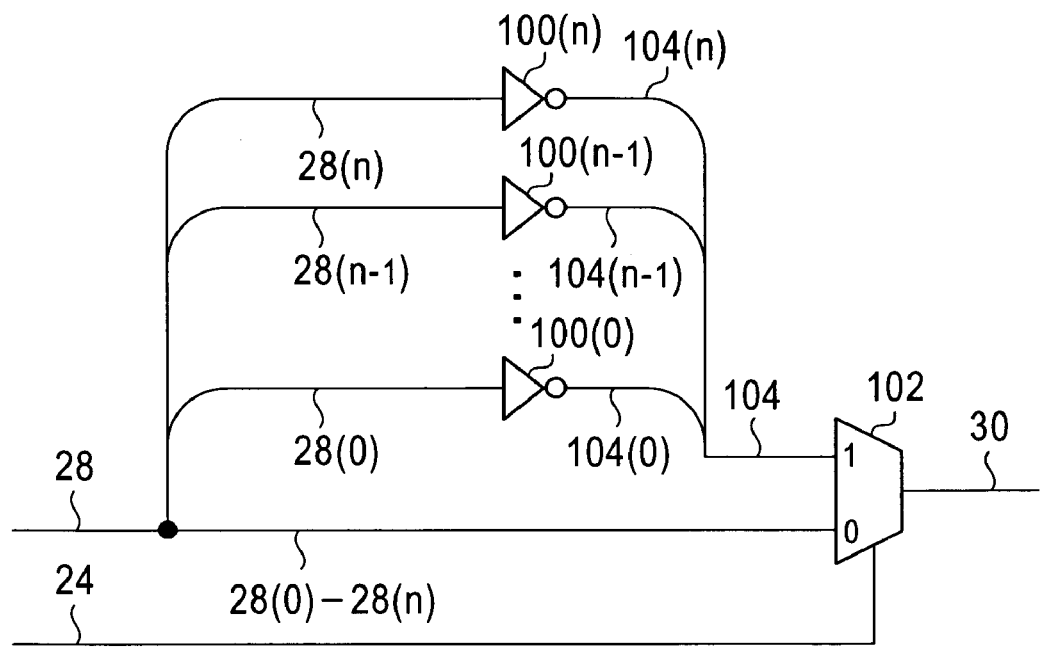
FIG. 2 is a circuit view showing an example of the configuration of an address inversion circuit in the memory device controlling apparatus shown in FIG. 1.

When the access signal 24 supplied from the address decoder 10 is logic "1," the address inversion circuit 16 which is connected to the address decoder 10 and the address generation circuit 14 inverts and outputs each bit of the address signal 28 generated in the address generation circuit 14. When the access signal 24 is logic "0," the address inversion circuit 16 outputs the address signal 28 as it is. FIG. 2 shows an example of the configuration of the address inversion circuit 16.

In FIG. 2, a least significant bit 28(0) to a most significant bit 28(n) forming the address signal 28 are input to a selector 102, as well as to inverter circuits 100(0) to 100(n), respectively. The inverter circuits 100(0) to 100(n) invert the bits 28(0) to 28(n) and output bits 104(0) to 104(n) to the selector 102, respectively. Thereby the address signal 28 is transformed into the address signal 104 to access the RAM 18 in descending order from a final address. The selector 102 selects the address signal 104 when the access signal 24 is logic "1" or the address signal 28 when the access signal 24 is logic "0," and outputs the selected signal as the address signal 30.

Back to FIG. 1, the RAM 18 connected to the OR circuit 12 and the address inversion circuit 16 is a memory device that writes/reads data or programs to an address shown by the address signal 30 supplied from the address inversion circuit 16 when the chip enable signal 26 supplied from the OR circuit 12 shows logic "1."

An operation of the memory device controlling apparatus as described above will be described below. The address decoder 10 generates the access signal 22 and the access signal 24 by decoding the address signal 20. The access signal 22 and the access signal 24 are input to the OR circuit 12 and the access signal 24 is further input to the address inversion circuit 16. The OR circuit 12 generates the chip enable signal 26 by implementing a logical OR of the access signal 22 and the access signal 24. The chip enable signal 26 is input to the RAM 18.

On the other hand, the address generation circuit 14 generates the address signal 28 based upon an address signal 84, which is supplied to the RAM 18. Herein the address signal 28, as described before, is an address signal to access the RAM 18 in ascending order from the head address to the final address when the address signal 20 is a signal generated in ascending order from the head address of the RAM address space or the ROM address space. The address signal 28 is input to the address inversion circuit 16.

The address inversion circuit 16 inverts and outputs each bit of the address signal 28 outputted from the address generation circuit 14 when the access signal 24 is logic "1." When the access signal 24 is logic "0," the address inversion circuit 16 outputs the address signal 28 without the inversion as it is. Herein since the address signal 28 is an address signal to access the RAM 18 in ascending order from the head address to the final address, the inverted address signal is an address signal to access the RAM 18 in descending order from the final address to the head address. An output of the address inversion circuit 16 is input to the RAM 18 as the address signal 30.

Accordingly, the RAM 18 is accessed from the head address in ascending order when the address signal 20 is an address signal of the RAM address space, or is accessed in descending order from the final address when the address signal 20 is an address signal of the ROM address space. Namely, the RAM 18 is used as the RAM from the head address in descending order and as the ROM from the final address in ascending order. The RAM 18 may be used as the ROM from the head address in descending order and as the RAM from the final address in ascending order.

According to the first embodiment as described above, since the RAM 18 is used from the head address in ascending order to the first space (for example, RAM address space) of the address space controlled or managed by the CPU and is used from the final address in descending order to the second space (for example, ROM address space), each capacity of the mounted physical RAMs 18 in the region appropriated to the RAM address space and in the region appropriated to the ROM address space can be variable, to broaden an application of the physical RAM. For example, in the development using an EVA chip a capacity of a memory device can be easily changed in response to development progress of software.

Figure 3:
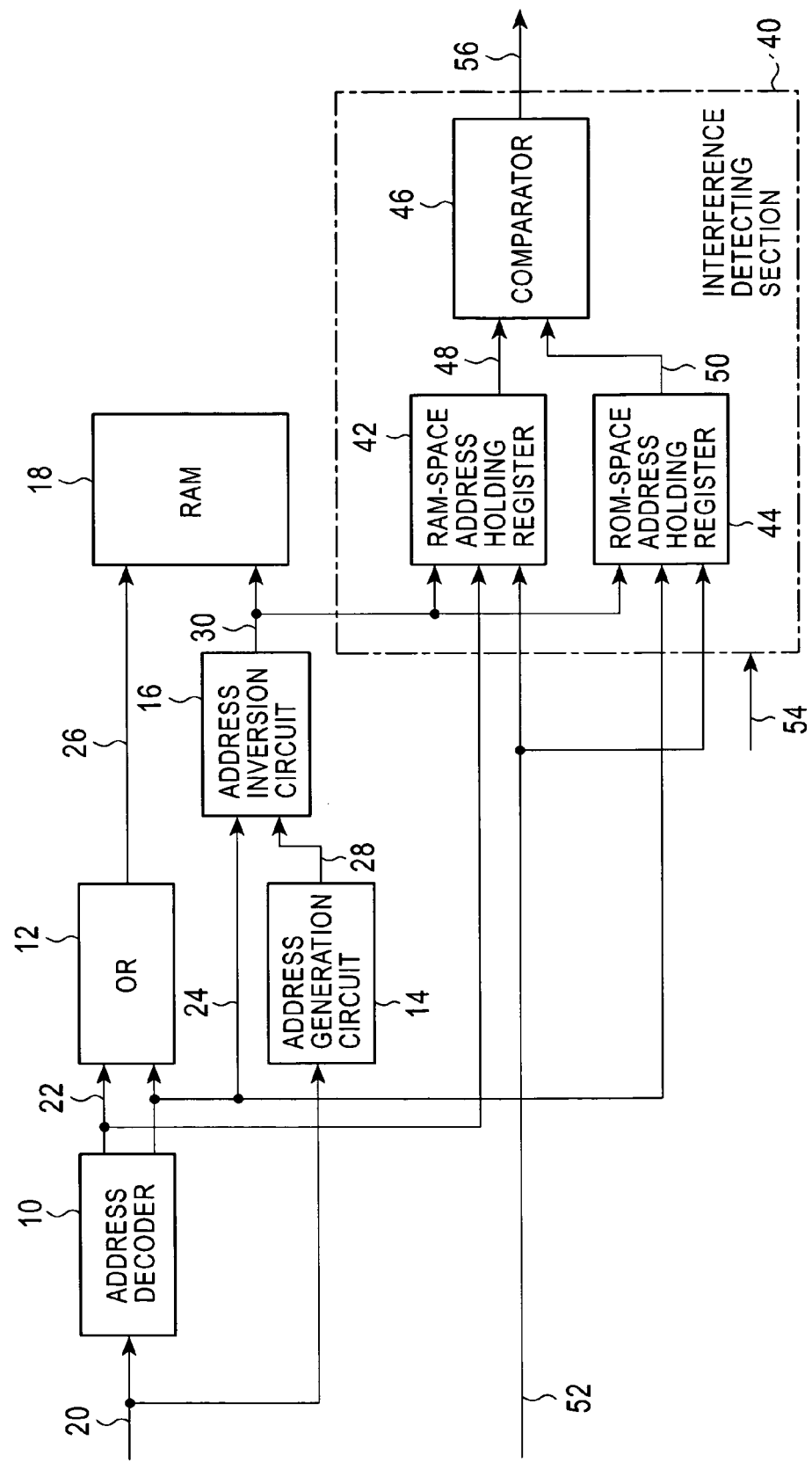
FIG. 3 is a block diagram showing a second embodiment of a memory device controlling apparatus according to the present invention.

FIG. 3 is a second embodiment of a memory device controlling apparatus according to the present invention where an interference detector 40 is added to the memory device controlling apparatus shown in FIG. 1. In the second embodiment, the interference detector 40 detects an interference state between a region of the RAM 18 corresponding to the RAM address space of the address space controlled by the outside CPU and a region of the RAM 18 corresponding to the ROM address space, and makes a notification of the detection to the outside. However, since the address decoder 10, the OR circuit 12, the address generation circuit 14, the address inversion circuit 16, and the RAM 18 are identical respectively to components which the identical reference numerals are attached to, the interference detector 40 will be mainly explained.

The interference detector 40 includes an RAM-space address holding register 42, an ROM-space address holding register 44, and comparators 46 connected to the holding registers 42 and 44. Each input side of the RAM-space address holding register 42 and the ROM-space address holding register 44 is connected to the address decoder 10, the address inversion circuit 16, and a synchronous bus synchronizing by a single clock, and receives inputs from the access signal 24, the address signal 30, and the synchronous clock 52.

Figure 4:
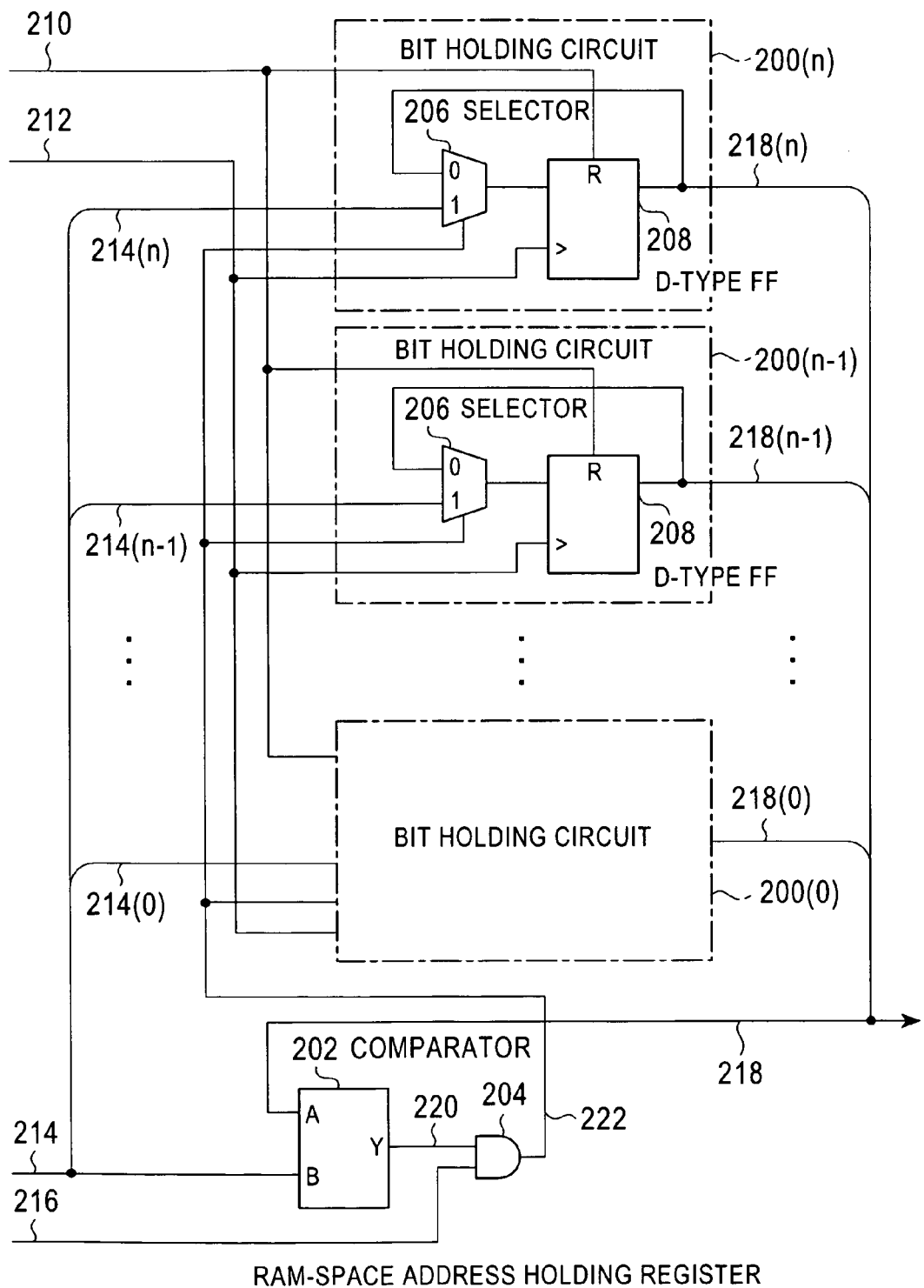
FIG. 4 is a circuit view showing an example of the configuration of an address holding register in a RAM space in the memory device controlling apparatus shown in FIG. 3.

The RAM-space address holding register 42 is a module for holding the largest address signal out of the address signals 30 supplied to the RAM 18 when the access signal 22 output from the address decoder 10 is logic "1" and the access signal 24 is logic "0." The RAM-space address holding register 42, as shown in FIG. 4, includes an n+1 number of bit holding circuits 200(0) to 200(n), a comparator 202, and an AND circuit 204. In addition, a reset signal 210, a synchronous clock 212, an address signal 214, and an access signal 216 which are input from outside correspond to the reset signal 54, the synchronous clock 52, the address signal 30, and the access signal 22 of FIG. 3, respectively.

The bit holding circuits 200(0) to 200(n) hold from a least significant bit 214(0) to a most significant bit 214(n) bit by bit, respectively, and each bit holding circuit has the same configuration. For example, the bit holding circuit 200(n) is formed of a selector 206 and a D-type flip flop 208 (D-type FF). Outputs 218(n) of the bit 214(n) and the D-type flip flop 208 are input to the selector 206 and an output of the selector 206 is input to the D-type flip flop 208.

The selector 206 selects the bit 214(n) when an output 222 of the AND circuit 204 is logic "1," or when the output 222 thereof is logic "0," selects the output bit 218(n) of the D-type flip flop 208 to output. The D-type flip flop 208 receives the output from the selector 206 according to the synchronous clock 212 and outputs a bit 218(n). Accordingly, the bit holding circuit 218(n) outputs the bit 214(n) to be input as the bit 218(n) when the output 222 of the AND circuit 204 is logic "1," or holds the bit 218(n) output just before as it is when the output 222 is logic "0." In addition, the D-type flip flop 208 is initialized by the reset signal 210 and the bit 214 (n) is set as logic "0."

The comparator 202 connected to the bit holding circuits 200(0) to 200(n) is a magnitude comparator. The comparator 202 compares an input A with an input B. When A<B, an output Y is set as logic "1," and when A≧B, the output Y is set as logic "0." More specifically, the address signal 218 formed of the bits 218(0) to 218(n) output from the bit holding circuits 200(0) to 200(n), and the address signal 214 from an outside are compared. When the address signal 214 is larger than the address signal 218, the output is set as logic "1" and otherwise logic "0." The AND circuit 204 is a gate circuit outputting an output 220 of the comparator 202 as the output 222 when the access signal 216 is logic "1."

The RAM-space address holding register 42 configured as described above compares the input address signal 214 with the address signal 218 which the register 42 is holding when the access signal 216 is logic "1." When the address signal 214 is larger than the address signal 218, the register 42 newly holds the address signal 214 and when the address signal 214 is not larger than the address signal 218, the register 42 holds the holding address signal 218 as it is. Such operation is repeated for each time the address signal 214 is input. Accordingly, the RAM-space address holding register 42 is adapted to hold the uppermost address signal out of the address signals 214 inputted after the bit holding circuits 200(0) to 200(n) are initialized.

Figure 5:
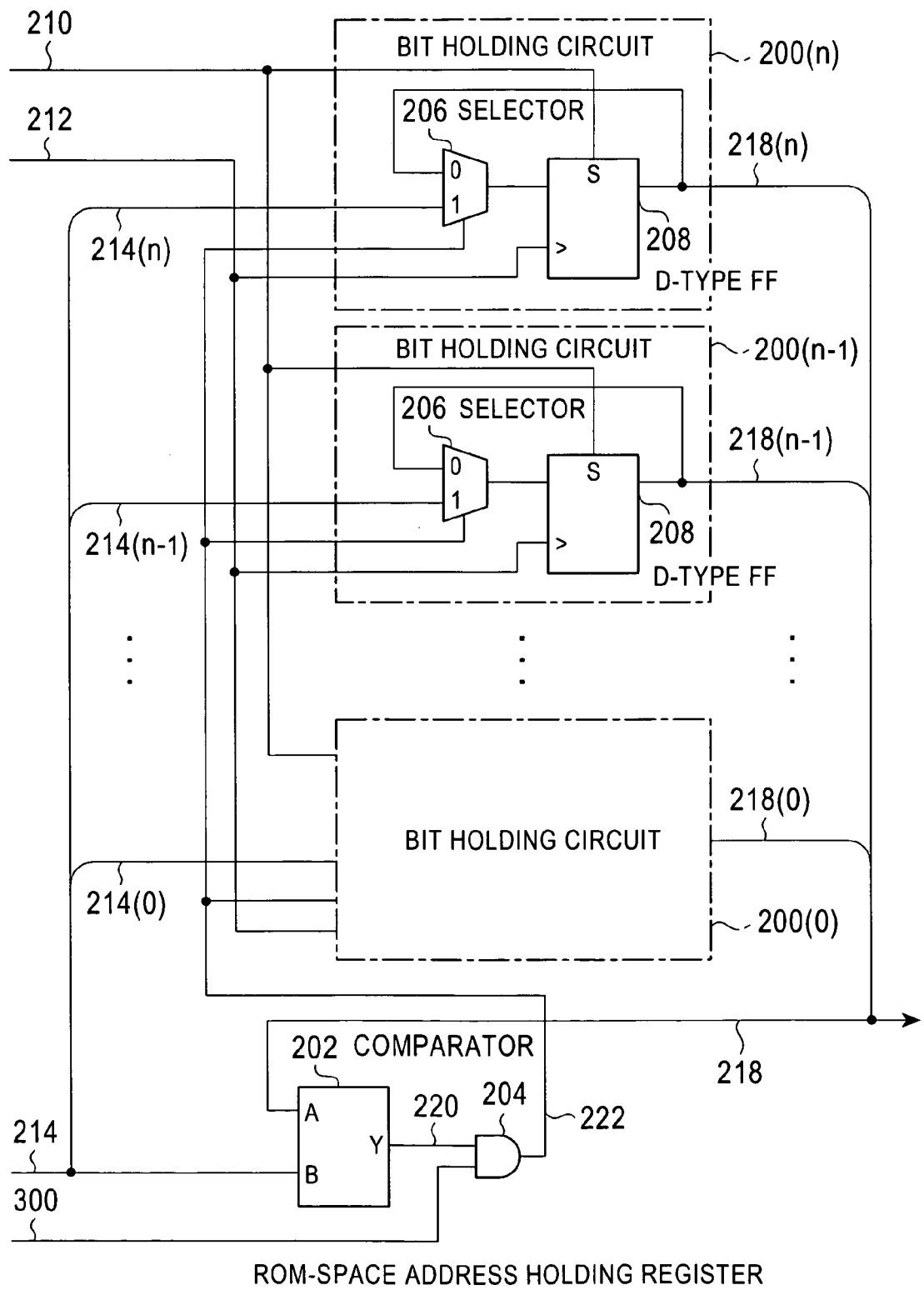
FIG. 5 is a circuit view showing an example of the configuration of an address holding register in a ROM space in the memory device controlling apparatus shown in FIG. 3.
Figure 6:
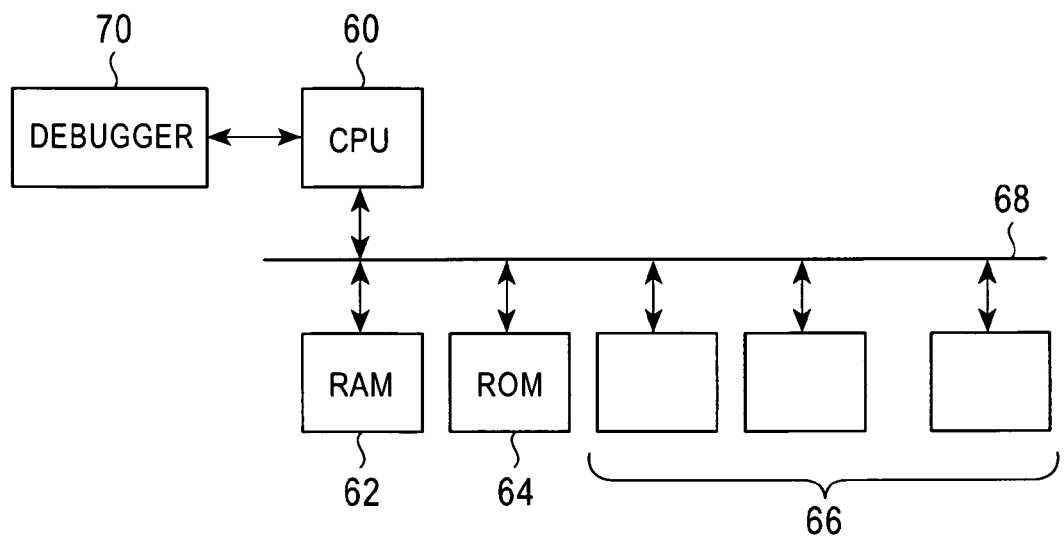
FIG. 6 is a block diagram showing an example of the configuration of a conventional EVA chip.
Figure 7:
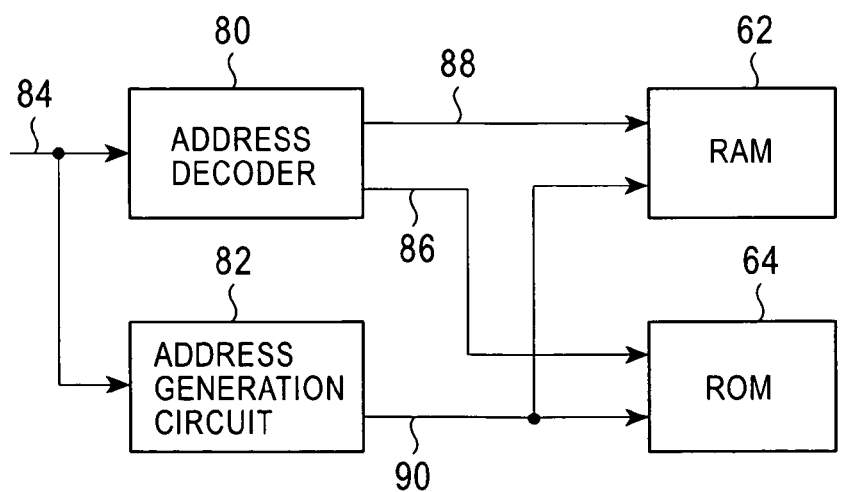
FIG. 7 is a more detailed view showing portions of a RAM and a ROM in the EVA chip shown in FIG. 6.
Figure 8:
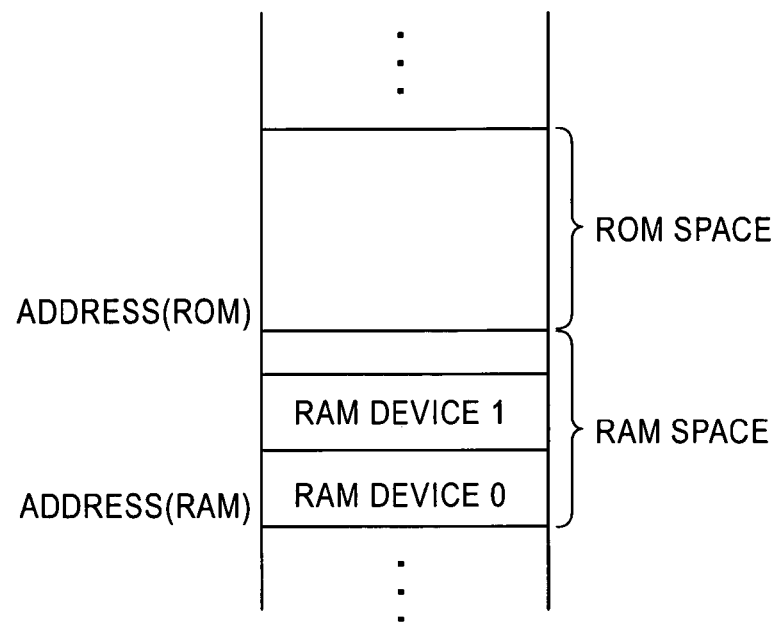
FIG. 8 is a view showing an example where a RAM device 0 and a RAM device 1 are provided in a part of a RAM space in an address space controlled by a CPU.
Figure 9:
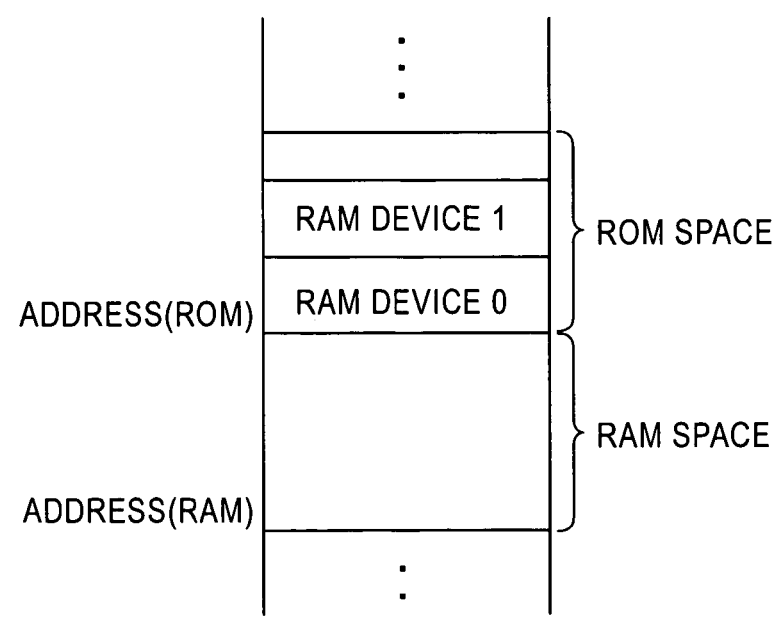
FIG. 9 is a view showing an example where a RAM device 0 and a RAM device 1 are provided in a part of a ROM space in an address space controlled by a CPU.
Figure 10:
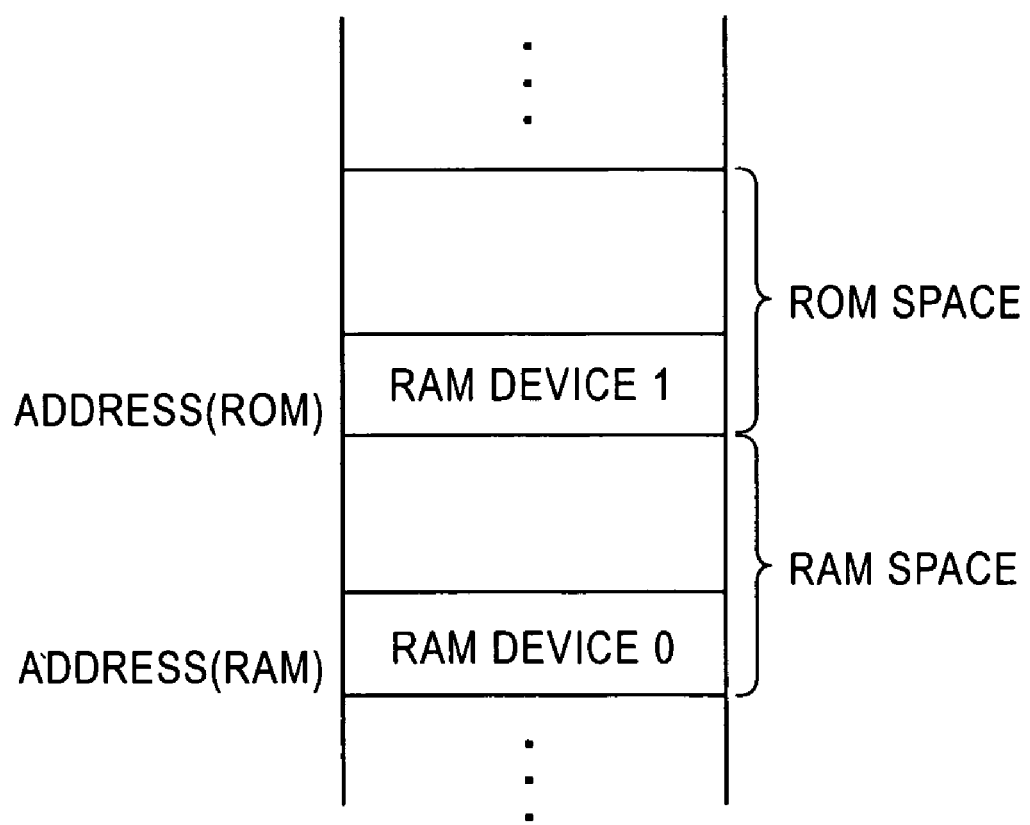
FIG. 10 is a view showing an example where a RAM device 0 and a RAM device 1 are provided in parts of a ROM space and a RAM space, respectively, in an address space controlled by a CPU.

On the other hand, the ROM-space address holding register 44 is a module which holds the smallest address signal out of the address signals 30 supplied to the RAM 18 when the access signal 24 output from the address decoder 10 is logic "1." FIG. 5 is an example of the configuration of the ROM-space address holding register 44. This ROM-space address holding register 44 is basically the same as the RAM-space address holding register 42 in FIG. 4 and is formed of an n+1 number of bit holding circuits 200(0) to 200(n), the comparator 202, and the AND circuit 204.

However, in the ROM-space address holding register 44, an access signal 300 (=the access signal 24 output from the address decoder 10 in FIG. 3) instead of the access signal 216 is input to the AND circuit 204. The D-type flip flop 208 of each of the bit holding circuits 200(0) to 200(n) holds logic "1" when the reset signal 210 is impressed. The comparator 202 sets the output 220 as logic "1" when the address signal 214 is smaller than the address signal 218 formed of the bits 218(0) to 218(n) held at the bit holding circuits 200(0) to 200(n). The AND circuit 204 outputs, as the output 222, the output 220 of the comparator 202 when the access signal 300 is logic "1."

The ROM-space address holding register 44 configured as described above compares the input address signal 214 with the address signal 218 which the register 44 is holding when the access signal 300 is logic "1." When the address signal 214 is smaller than the address signal 218, the register 44 newly holds the address signal 214. When the address signal 214 is not smaller than the address signal 218, the register 44 holds the holding address signal 218 as it is. Such operation is repeated for each time the address signal 214 is input. Accordingly the ROM-space address holding register 44 is adapted to hold the lowest address signal out of the address signals 214 input after the bit holding circuits 200(0) to 200(n) are initialized.

Back to FIG. 3, the RAM-space address holding register 42 and the ROM-space address holding register 44 output the address signals held as the address signal 48 and as the address signal 50 respectively. The comparator 46 compares the address signal 48 with the address signal 50. When the address signal 48≦the address signal 50, it is determined that the access to access the RAM 18 as the RAM appropriated to the RAM address space and the access to access the RAM 18 as the ROM appropriated to the ROM address space are exclusive among the RAM 18 and are in a normal state.

However, when the address signal 48>the address signal 50, it is determined that the access to access the RAM 18 as the RAM appropriated to the RAM address space and the access to access the RAM 18 as the ROM appropriated to the ROM address space are interfered with each other among the RAM 18 and are in an abnormal state. As a result, the comparator 46 outputs a warning 56. However, the warning may be output when K=(address signal 50)−(address signal 48) goes beyond a predetermined value.

According to the second embodiment as described above, since the uppermost address signal out of the address signals 30 to access the RAM 18 as the RAM appropriated to the RAM address space and the lowest address signal out of the address signals 30 to access the RAM 18 as the ROM appropriated to the ROM address space are compared, it is possible to detect an interference state where the region corresponding to the RAM address space in the RAM 18 interfere with the region corresponding to the ROM address space in the RAM 18. Accordingly the CPU can take certain measures at the earliest stage based upon the warning 56 output from the memory device controlling apparatus. For example, when the access occurs in an unexpected region of the physical RAM at the software in the development using the EVA chip, the occurrence of access can be found at an early stage.

Further, in the first and second embodiments, an address impress per a byte unit is assumed, but the address impress per a word unit can be used. In this case, for example, in the case of using the address impress per a four-byte unit, it is required to impress a byte select signal to the RAM 18 by shifting the output of the address generation circuit 14 in FIGS. 1 and 3 in the right direction by two bits.

The present invention can be applied to software operating on a microcomputer, an evaluation-chip provided for a developing system with IP (intellectual Property) or the like, or a microcomputer itself.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2004-064918 which is hereby incorporated by reference.

What is claimed is:

1. A method of controlling a memory device, for appropriating the memory device to a first address space and a second address space in an address space which is managed by a central processing unit, comprising the steps of:

generating, when an address signal of the first address space is provided from the central processing unit, a first address signal to access the memory device from a head address in ascending order based upon the address signal to supply the first address signal to the memory device;

generating, when an address signal of the second address space is provided from the central processing unit, a second address signal to access the memory device from a final address in descending order based upon the address signal to supply the second address signal to memory device;

generating, when the address signal of the second address space is provided from the central processing unit, a third address signal to access the memory device from the head address in ascending order based upon the address signal; and inverting the third address signal to generate the second address signal.

2. The method of controlling a memory device according to claim 1, wherein the memory device is a RAM.

3. The method of controlling a memory device according to claim 2, further comprising the steps of:

setting a space provided as a RAM or a ROM in the first address space and setting a space provided as a RAM or a ROM in the second address space;

using the RAM serving as the memory device as a RAM or a ROM by supplying the first address signal; and using the RAM serving as the memory device as a ROM or a RAM by supplying the second address signal.

4. The method of controlling a memory device according to claim 1, further comprising the steps of:

holding an uppermost address signal out of the first address signals supplied to the memory device and a lowest address signal out of the second address signals supplied to the memory device; and outputting, when the uppermost address signal becomes at least larger than the lowest address signal, a warning.

5. A memory device controlling apparatus for appropriating a memory device to a first address space and a second address space in an address space which is managed by a central processing unit, comprising:

address decode means for generating a first access signal when an address signal of the first address space is provided from the central processing unit and generating a second access signal when an address signal of the second address space is provided from the central processing unit;

logic operation OR means for generating a chip enable signal by implementing a logical OR operation of a first access signal and a second access signal generated by the address decode means to output the chip enable signal to the memory device;

address generation means for generating a third address signal to access the memory device from a head address in ascending order based upon an address signal provided from the central processing unit; and address-inverting means for inverting the third address signal generated by the address generation means for supply to the memory device when the second access signal is generated by the address decode means, and supplying the third address signal as it is to the memory device when the second access signal is not generated.

* * * * *